United States Patent
Moritz et al.

(10) Patent No.: US 6,334,266 B1
(45) Date of Patent: Jan. 1, 2002

(54) SUPERCRITICAL FLUID DRYING SYSTEM AND METHOD OF USE

(75) Inventors: Heiko D Moritz, Nashua; Jonathan A. Talbott, Amherst; Mohan Chandra, Merrimack; James A. Tseronis, Manchester; Ijaz Jafri, Nashua, all of NH (US)

(73) Assignee: S.C. Fluids, Inc., Nashua, NH (US)

( * ) Notice: Subject to any disclaimer, the term of this patent is extended or adjusted under 35 U.S.C. 154(b) by 0 days.

(21) Appl. No.: 09/665,932

(22) Filed: Sep. 20, 2000

Related U.S. Application Data (63) Continuation-in-part of application No. 09/632,770, filed on Aug. 4, 2000
(60) Provisional application No. 60/155,454, filed on Sep. 20, 1999.

(51) Int. Cl.[7] .................................................. F26B 3/00
(52) U.S. Cl. .............................. 34/337; 34/343; 34/393; 34/467; 34/62; 34/218; 134/902; 414/416; 414/811; 118/725
(58) Field of Search .......................... 34/329, 330, 337, 34/343, 357, 391, 393, 418, 419, 467, 62, 202, 218; 454/187; 414/416, 811; 134/902; 118/715, 719, 725, 728; 432/18, 120, 122

(56) References Cited

U.S. PATENT DOCUMENTS

| | | |
|---|---|---|
| 3,744,660 A | 7/1973 | Gaines et al. |
| 3,968,885 A | 7/1976 | Hassan et al. |

(List continued on next page.)

FOREIGN PATENT DOCUMENTS

| | | |
|---|---|---|
| EP | 0 903 775 A2 | 3/1999 |
| JP | 1-246835 | 10/1989 |

OTHER PUBLICATIONS

PCT International Search Report dated May 31, 2001 of International Application No. PCT/US00/03796 filed Feb. 5, 2001.

*Primary Examiner*—Pamela Wilson
(74) *Attorney, Agent, or Firm*—Vernon C. Maine; Scott J. Asmus (57) ABSTRACT

A method and apparatus for fabricating and drying wafers, including micro-electro-mechanical system (MEMS) structures, in a second, supercritical processing fluid environment. The apparatus utilizes an inverted pressure vessel connected to a supercritical processing fluid supply and recover system, with an internal heat exchanger connected to external heating and cooling sources, which is closed with a vertically movable base plate. A wafer cassette configured for supporting multiple wafers is submerged in a first processing fluid within a container, which is installed on the base plate for insertion into the pressure vessel. Vessel inlet and outlet tubes extend vertically downward from the ceiling of the pressure vessel to nearly the base plate. Container inlet and outlet tubes extend vertically downward from the ceiling of the pressure vessel to inside the container and nearly to the bottom of the container. The tubes provide for displacement of the first processing fluid with the second processing fluid still in a liquid state, from which it is raised to supercritical state.

18 Claims, 7 Drawing Sheets

U.S. PATENT DOCUMENTS

| | | |
|---|---|---|
| 4,245,154 A | 1/1981 | Uehara et al. |
| 4,355,937 A | 10/1982 | Mack et al. |
| 4,422,651 A | 12/1983 | Platts |
| 4,522,788 A | 6/1985 | Sitek et al. |
| 4,626,509 A | 12/1986 | Lyman |
| 4,789,077 A | 12/1988 | Noe |
| 4,823,976 A | 4/1989 | White, III et al. |
| 4,827,867 A | 5/1989 | Takei et al. |
| 4,879,431 A | 11/1989 | Bertonicini |
| 5,071,023 A | 12/1991 | Perrot |
| 5,071,485 A | 12/1991 | Matthews et al. |
| 5,167,716 A | 12/1992 | Boitnott et al. |
| 5,169,408 A | 12/1992 | Biggerstaff et al. |
| 5,191,993 A | 3/1993 | Wanger et al. |
| 5,221,019 A | 6/1993 | Pechacek et al. |
| 5,224,504 A | 7/1993 | Thompson et al. |
| 5,236,669 A | 8/1993 | Simmons et al. |
| 5,251,776 A | 10/1993 | Morgan, Jr. et al. |
| 5,280,693 A | 1/1994 | Heudecker |
| 5,314,574 A | 5/1994 | Takahashi |
| 5,433,334 A | 7/1995 | Reneau |
| 5,571,330 A | 11/1996 | Kyogoku |
| 5,589,224 A | 12/1996 | Tepman et al. |
| 5,621,982 A | 4/1997 | Yamashita et al. |
| 5,644,855 A | 7/1997 | McDermott et al. |
| 5,706,319 A | 1/1998 | Holtz |
| 5,746,008 A | 5/1998 | Yamashita et al. |
| 5,900,107 A | 5/1999 | Murphy et al. |
| 5,934,991 A | 8/1999 | Rush |
| 5,989,342 A | 11/1999 | Ikeda et al. |
| 5,992,680 A | 11/1999 | Smith |
| 6,029,371 A | 2/2000 | Kamikawa et al. |
| 6,053,348 A | 4/2000 | Morch |
| 6,085,935 A | 7/2000 | Malchow et al. |
| 6,097,015 A | 8/2000 | McCullough et al. |
| 6,128,830 A * | 10/2000 | Bettcher et al. ............... 34/404 |
| 6,164,297 A * | 12/2000 | Kamikawa ................... 134/61 |
| 6,216,364 B1 * | 4/2001 | Tanaka et al. ................ 34/448 |

* cited by examiner

SUPERCRITICAL FLUID DRYING SYSTEM AND METHOD OF USE

This is a continuation in-part of Application No. U.S. 09/632,770, filed Aug. 4, 2000 and this application further claims the benefit of U.S. Provisional Application No. 60/155,454 filed Sep. 20, 1999.

BACKGROUND OF THE INVENTION

1. Technical Field of the Invention

This invention relates to methods and apparatus for the fabrication of micro-electro-mechanical systems (MEMS), micro-opto-mechanical systems (MOEMS), surface micro machined systems, and similar wafer-mounted microstructures; and in particular to methods and apparatus for applying supercritical fluid drying techniques in the fabrication of microstructures.

2. Background Art

Figure 1A:
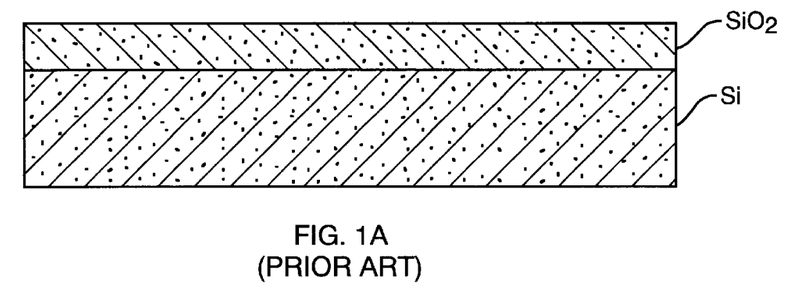
FIG. 1 is a prior art representation of the sequential steps in the manufacturing of a typical Sacrificial Surface Micromachined (SSM) microelectromechanical system (MEMS) based device.
Figure 1B:
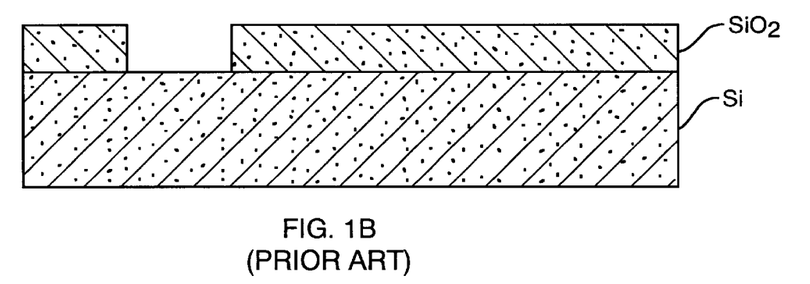
Figure 1C:
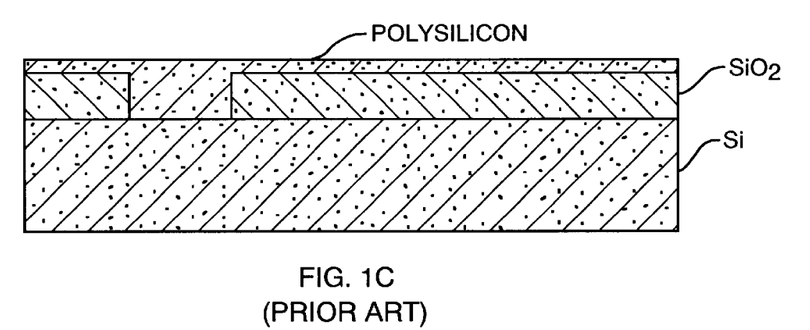
Figure 1D:
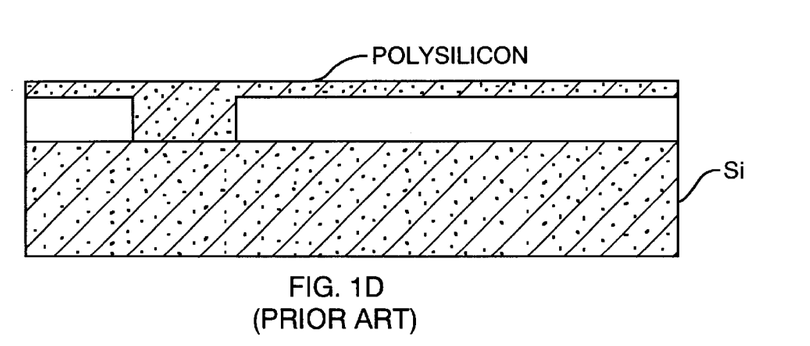

One method of manufacturing micro-electro-mechanical systems (MEMS) based devices is Sacrificial Surface Micromachining (SSM) or surface micromachining. FIG. 1 is a prior art illustration of a simple "anchored" SSM silicon based production process. In FIG. 1a, a substrate, such as Silicon, is deposited with a sacrificial material, such as grown Silicon Dioxide or $SiO_2$. In FIG. 1b, the sacrificial material is etched to open a hole for the anchor of the structure. In FIG. 1c, a structural material such as polysilicon is deposited on the sacrificial material. In FIG. 1d, the sacrificial material is etched away to release the structural layer, creating the microstructure. These steps can be repeated to form more complex multilevel structures. Although $SiO_2$ is a common material for a sacrificial layer, other materials like photoresists may be used in other applications.

After removal of the sacrificial material or sacrificial layer by etching or other methods the wafer has to be rinsed to remove any residual trace of the etch liquid. Rinsing usually is done with deionized water, which causes the problem of stiction upon drying.

Figure 2A:
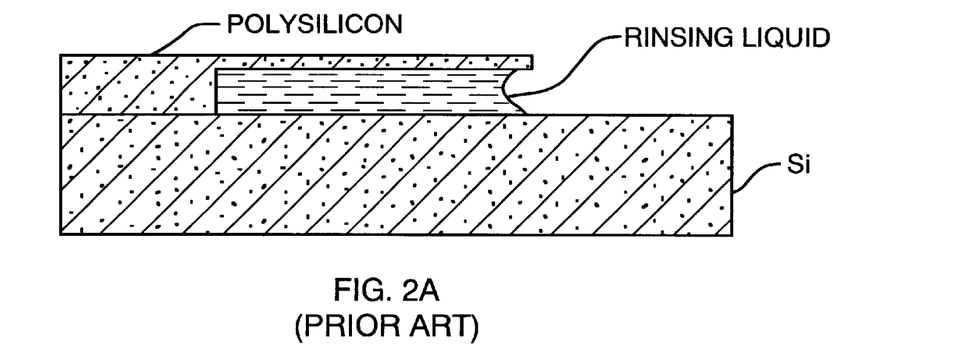
FIG. 2 is a prior art representation of the sequential steps device manufactured using Sacrificial Surface Micromachining method for manufacturing MEMS based device, experiencing stiction in the drying process.
Figure 2B:
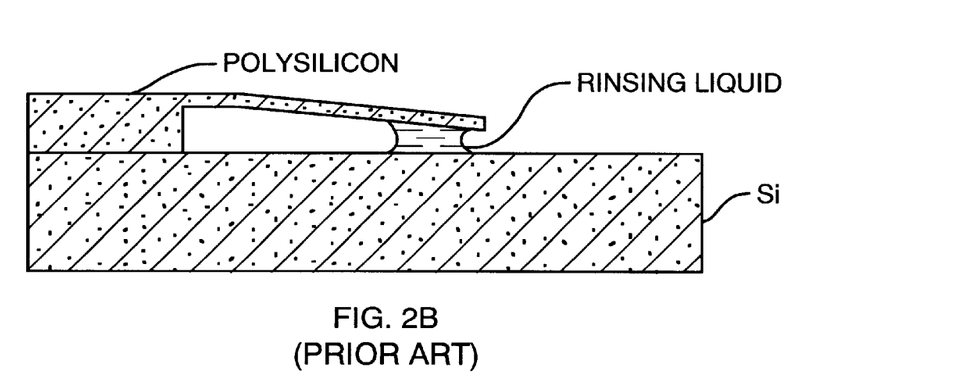
Figure 2C:
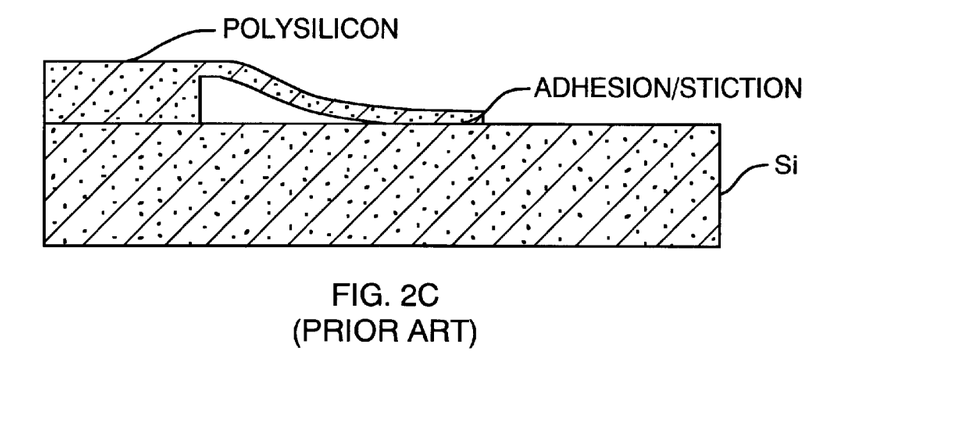

Stiction or adhesion occurs when a "released" structure adheres to another surface. FIG. 2 gives a visual representation of stiction and how it is generated. FIG. 2a, shows a properly released cantilevered polysilicon beam with rinsing liquid still trapped under it. FIG. 2b, shows how the capillary force generated upon drying of the rinsing liquid pulls the beam towards the silicon substrate. FIG. 2c, shows how the beam sticks to the substrate, rendering the device flawed.

The capillary force, responsible for the deformation of a beam upon drying as illustrated in FIG. 2, is represented by the following equation:

$$F_m = \frac{\gamma A}{h}(\cos\theta_1 + \cos\theta_2)$$

where $\gamma$ is the surface tension of the rinsing liquid, A is the surface area that the beam shares with the substrate, h is the height of the gap between the surface of the substrate and the beam, and $\theta_1$ and $\theta_2$ are the contact angles of the rinsing liquid with the substrate and the beam, respectively.

There are two methods of controlling the capillary force, (i) manipulating the contact angle of the rinsing liquid by modifying the surface tension of the rinsing liquid, or (ii) reducing or eliminating the surface tension $\gamma$. The first method can only minimize the capillary force since the conditions of the surfaces in contact with the rinsing liquid, determining the contact angle, can vary. In addition, the condition of the rinsing liquid can vary during its use and may lead to unpredictable stiction and loss of yield.

Working to find improvements to the controlled release of microstructures without subsequent sticking of these structures to the substrate, researchers at the University of California at Berkeley have developed a process for drying silicon wafers in a supercritical fluid environment. In it's supercritical state, $\gamma$, the surface tension is zero, and therefore capillary forces cannot be built up as can be easily seen in the equation. If it is now possible to keep the environment surrounding the structure in a state with $\gamma=0$ during the whole drying process, stiction never occurs. The supercritical fluid of choice was $CO_2$, carbon dioxide, due to its low critical point, determined by a critical temperature $T_C$ of 31.1 degrees centigrade and a critical pressure $p_C$ of 1073 pounds per square inch over atmosphere.

Before $CO_2$ can be applied for drying, an intermediate process step has to be introduced based on the fact, that water, the rinsing liquid applied after the sacrificial etch step, is not miscible with $CO_2$. After rinsing, when the wafer still is wet with water, the water has to be replaced by a material that is miscible with $CO_2$. This material can be methanol or any other material that is to 100% miscible with $CO_2$. Furthermore, the wafer has to be kept submerged in methanol till it is safely deposited in the process chamber.

Using this laboratory method, a silicon wafer containing a pattern of microelectronic structure, having been fabricated in the conventional manner, but with the added step of replacing the rinsing liquid water by methanol, is introduced into a pressure vessel, with a horizontal orientation, submerged in methanol. To accomplish this, the pressure vessel is first filled with methanol. Then the operator quickly transfers the wafer into the vessel while deftly attempting to maintain a liquid layer of methanol on the wafer surface during this transport. The pressure vessel is then sealed, and a through-flow of liquid carbon dioxide is introduced for about 15 minutes. The methanol is rapidly absorbed into the liquid carbon dioxide and carried out of the pressure vessel. When the vessel has been entirely purged of methanol and is completely filled with pure liquid carbon dioxide, heat is applied uniformly for several minutes, causing the carbon dioxide to transition to its supercritical phase.

It is at this point that the benefit of the process is realized, as no liquid/vapor interface occurs during this transition. The $CO_2$ is then slowly vented to atmosphere. With the temperature kept higher than the critical temperature during venting, $CO_2$ does not experience a phase transition and remains in a state with the surface tension equal to zero.

Figure 3:
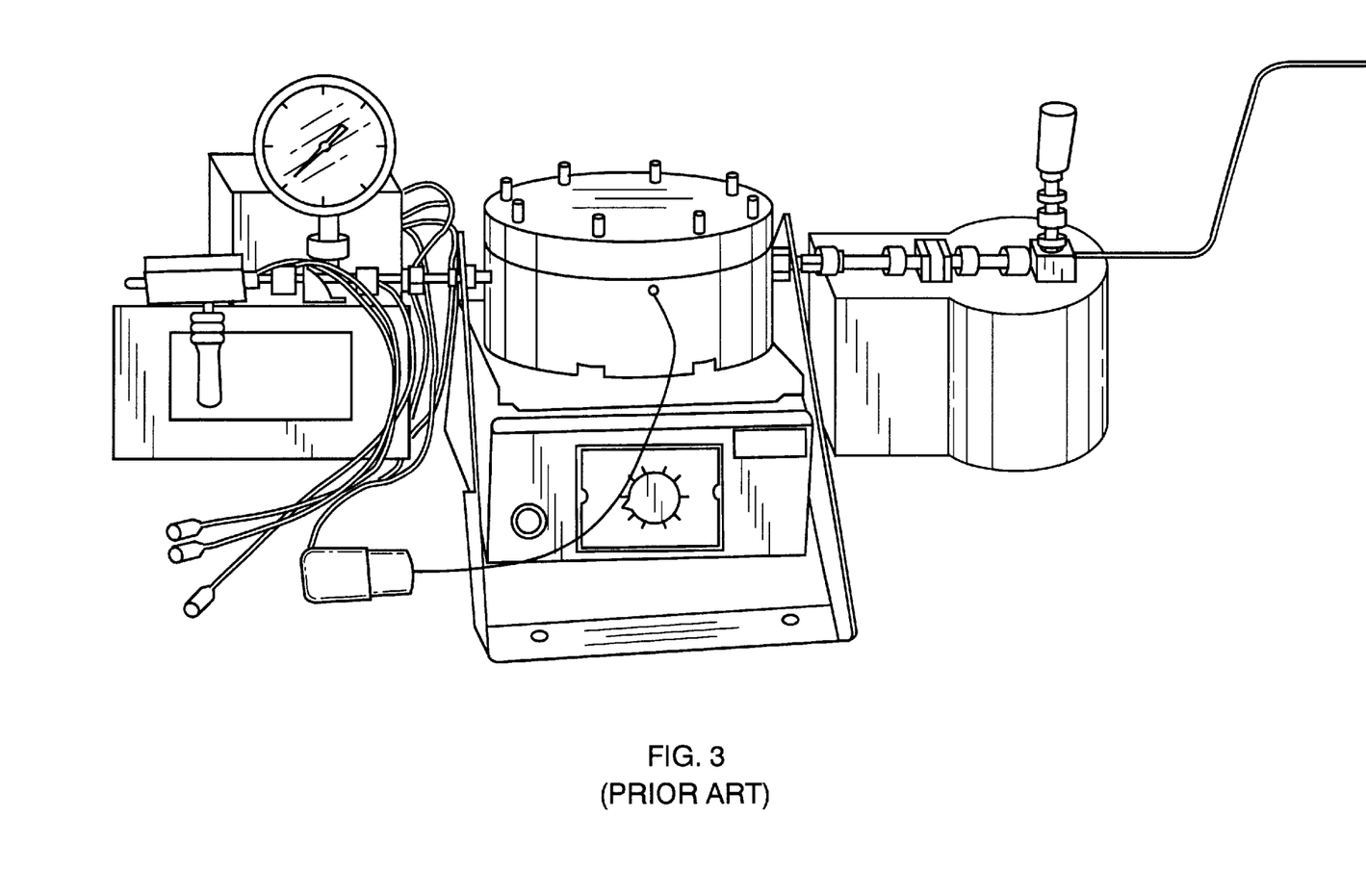
FIG. 3 is a perspective representation of the prior art laboratory apparatus for demonstrating the process of supercritical $CO_2$ drying of microstructures.

The prior art pressure vessel used in the laboratory setup for demonstrating this process is shown in FIG. 3. As is readily apparent from the figure, a vessel that can be opened in cross section and when closed is subjected to elevated temperature and pressure to this extent must be of substantial construction, with a locking mechanism adequate to safely sustain the total pressure applied. In the laboratory set up, a circumferential pattern of 8 bolts is used to secure the top to the base of the vessel, to contain the high pressure. Heat is applied to the vessel by external heaters, and ports in the vessel admit and remove the materials of the process.

There are several obvious problems with the laboratory set up that must be addressed in order to make this process sufficiently cost-effective and efficient for use in a production environment. The device is not suitable for integration into a production line with automated means for inserting and removing wafers; there is no safe transfer mechanism to ensure that a liquid layer is maintained on the wafer during the transport or transfer process; the closing mechanism of the pressure vessel is manual and too slow; and the serially administered steps of the process are manually accomplished and too slow for production requirements. The device is also lacking the safeguards required by industrial standards and regulations for production requirements.

During manufacturing, once the sacrificial layer is removed, if for any reason the wafer becomes dry, it can result in stiction or adhesion of devices onto the wafer substrate. Hence the transport of wafer from one manufacturing step to another manufacturing step without causing stiction is always a problem, and usually has been dependent on operator efficiency resulting in low device yields.

SUMMARY OF THE INVENTION

The invention, in its simplest form, is an apparatus and method for implementing and improving on the prior art methods for the drying of micro-electro-mechanical structures on silicon wafers or other substrate material or drying of wafers in general.

It is therefore an object of the invention to provide a practical and safe production mechanism for the $CO_2$ supercritical phase drying of wafers, and of microstructures on substrates.

It is a further object to provide for emplacement of the wafers or substrates into the pressure vessel submerged in a first process fluid or rinsing agent such as methanol, and to then directly displace the methanol with a second process fluid also in a liquid state, such as liquid carbon dioxide, this being connected within the pressure vessel and without disturbing the microstructures.

It is a yet further object to then elevate the second process fluid to supercritical state so as to cause the drying of the wafers with the benefits of the supercritical process, then reducing the pressure and temperature for recovery of the wafers.

Still other objects and advantages of the present invention will become readily apparent to those skilled in this art from the following detailed description, wherein we have shown and described only a preferred embodiment of the invention, simply by way of illustration of the best mode contemplated by me on carrying out our invention.

DESCRIPTION OF THE PREFERRED EMBODIMENT

The invention is susceptible of many variations. Accordingly, the drawings and following description of the preferred embodiment are to be regarded as illustrative in nature, and not as restrictive.

Figure 4:
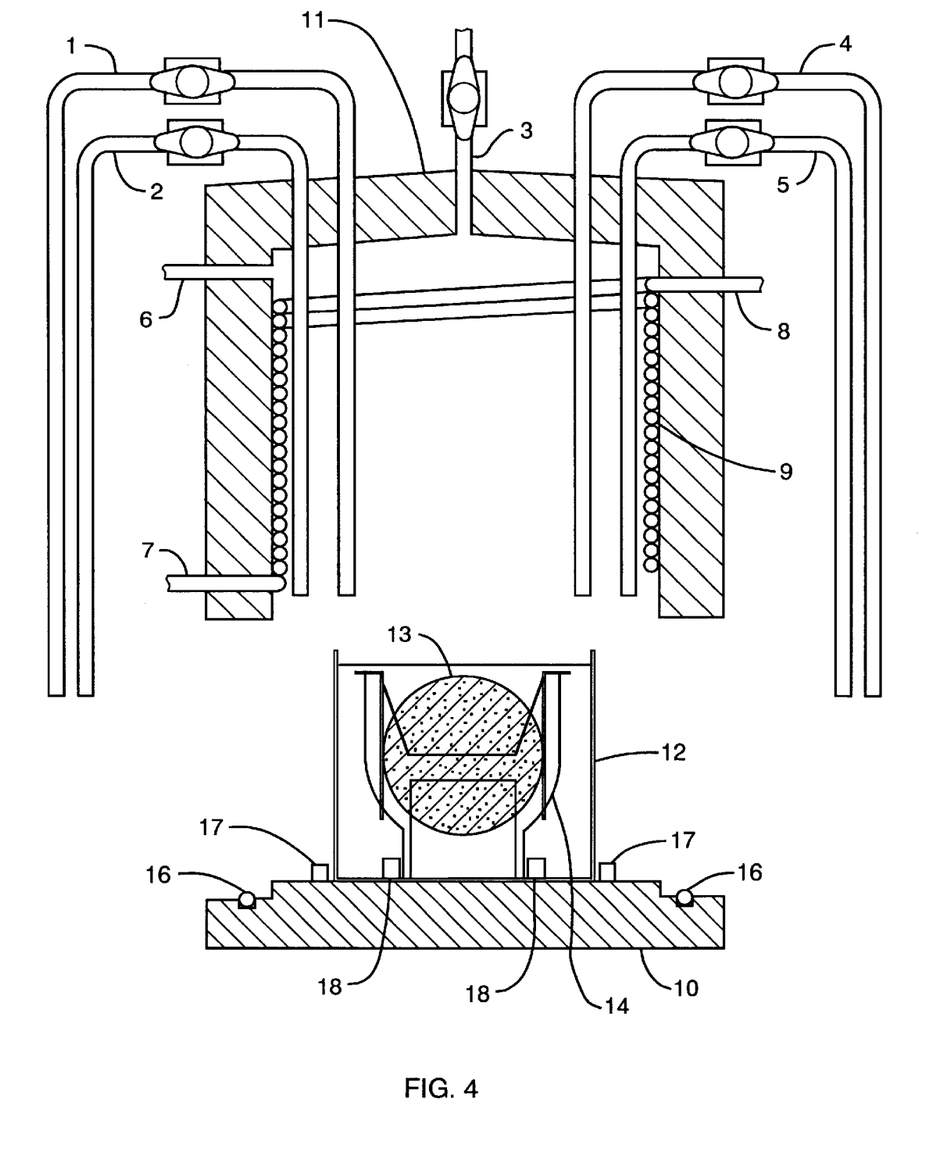
FIG. 4 is a diagrammatic cross section view of the preferred embodiment apparatus of the invention, illustrated with the base plate in an open position relative to the inverted pressure vessel.
Figure 5:
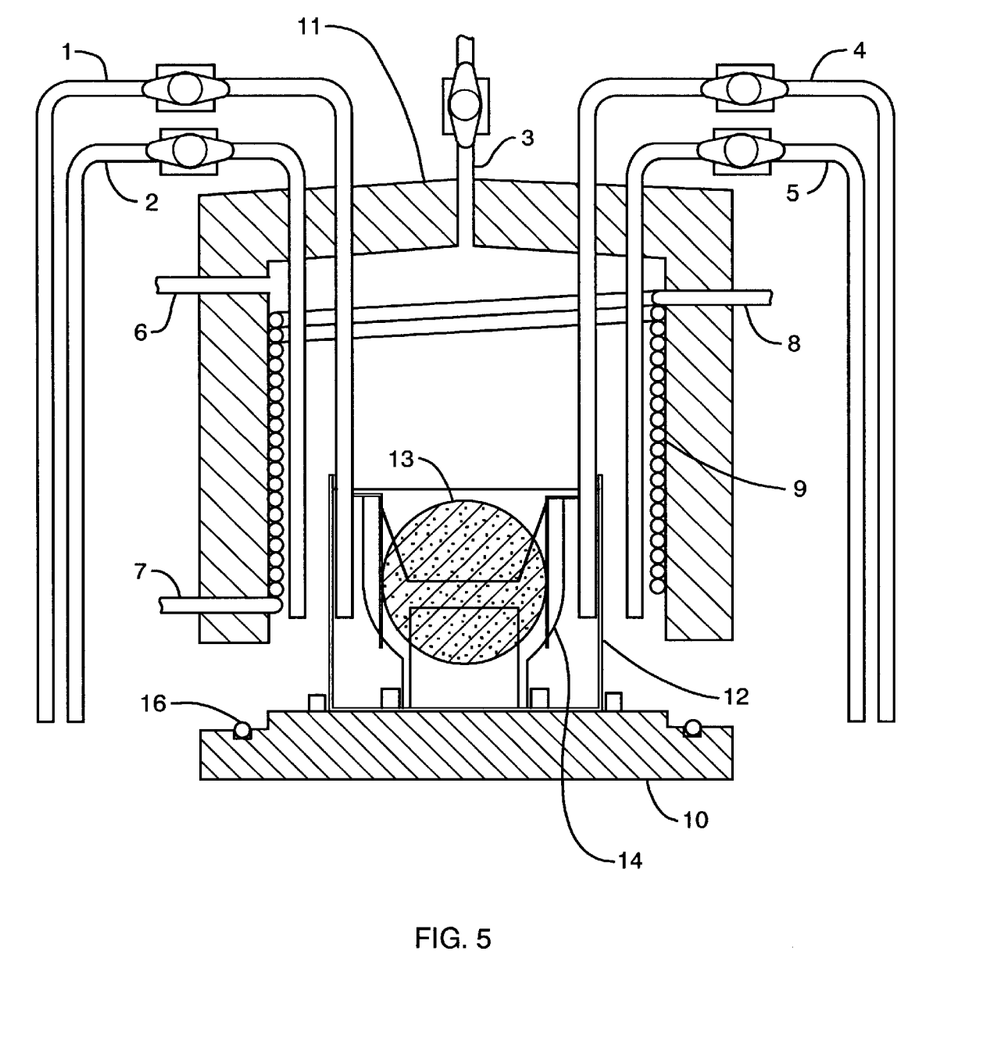
FIG. 5 is a diagrammatic cross section view of the embodiment of FIG. 4, in a partially closed position where vessel tubes and container tubes are extending downward, respectively outside and inside the container.
Figure 6:
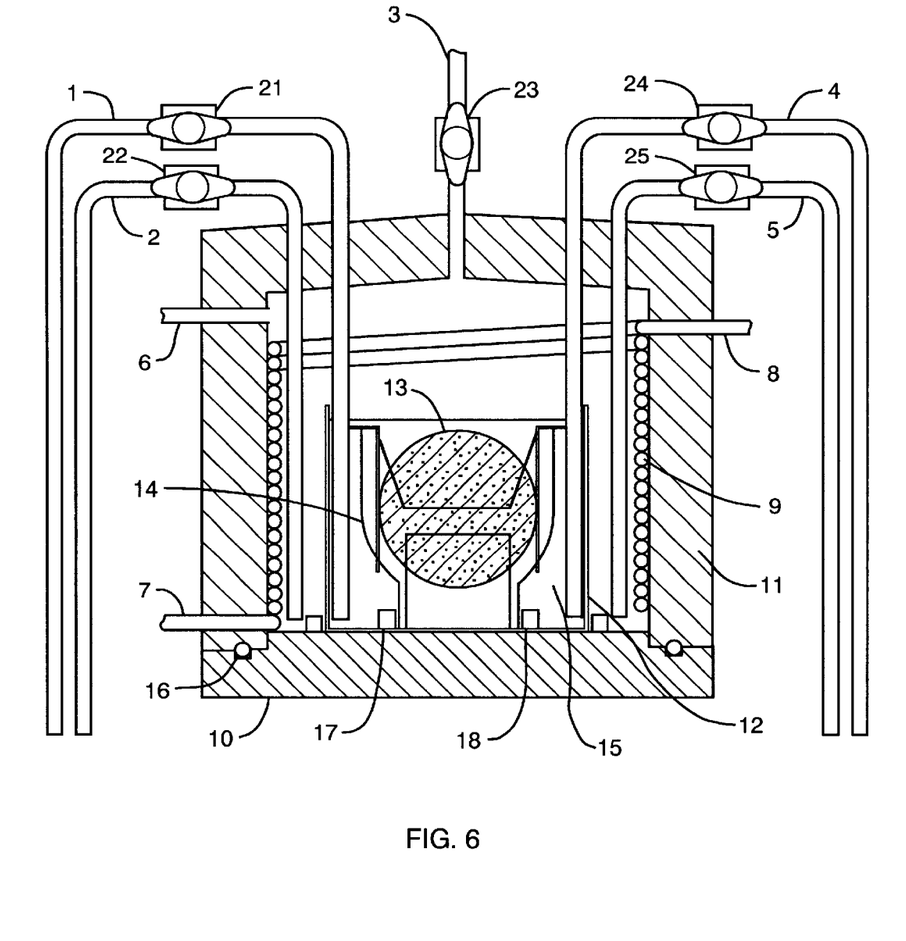
FIG. 6 is a diagrammatic cross section view of the embodiment of FIGS. 4 and 5, in a fully closed position, with the vessel and container tubes extending respectively to nearly the base plate and the bottom of the container.

Referring to FIGS. 4, 5 and 6, they show a preferred embodiment of the apparatus of the invention in its open, semi-open and closed positions, respectively. The apparatus can be operated with base plate (10), stationary, and pressure chamber (11), vertically movable; or with both base plate and pressure chamber movable; or with pressure chamber (11) held stationary and base plate (10) being vertically movable. In this preferred embodiment, we describe a stationary pressure chamber and moveable base plate.

An advantage of the inverted pressure vessel is the reduction of any particulates generated by a removable top and falling into the process environment. An advantage of the inverted, stationary vessel and movable base plate is the relative ease of elevating the base plate to the vessel, and the absence of flexible connections for supplying and removing process materials from the vessel.

Referring to FIG. 6, it shows base plate (10) and pressure chamber (11) made of stainless steel and electro-polished. Base plate (10) and pressure chamber (11) are sealed using an O-ring seal (16). One or more wafers (13) are placed in a wafer cassette (14) which is made of quartz or stainless steel. The wafer cassette is aligned in container (12) using cassette alignment fixture (18). The container (12) is placed on the base plate (10) using a container alignment fixture (17). The container (12) is filled with a process fluid (15), such as methanol or acetone. The choice of such fluid depends on its miscibility with liquid carbon dioxide.

The system contains internal heat exchanger (9) for heating and cooling the process fluid, for which external connections are provided through heat exchanger inlet (7) and heat exchanger outlet (8). The system incorporates rupture disk (6) as a safety feature to prevent over pressurization. The system also contains four process fluid lines that terminate in vertically extending tubes inside the pressure vessel; container inlet tube (1), vessel inlet tube (2), container outlet tube (4) and vessel outlet tube (5). Another line off the pressure vessel is provided for initial air purging of the system; purge line (3).

Figure 7:
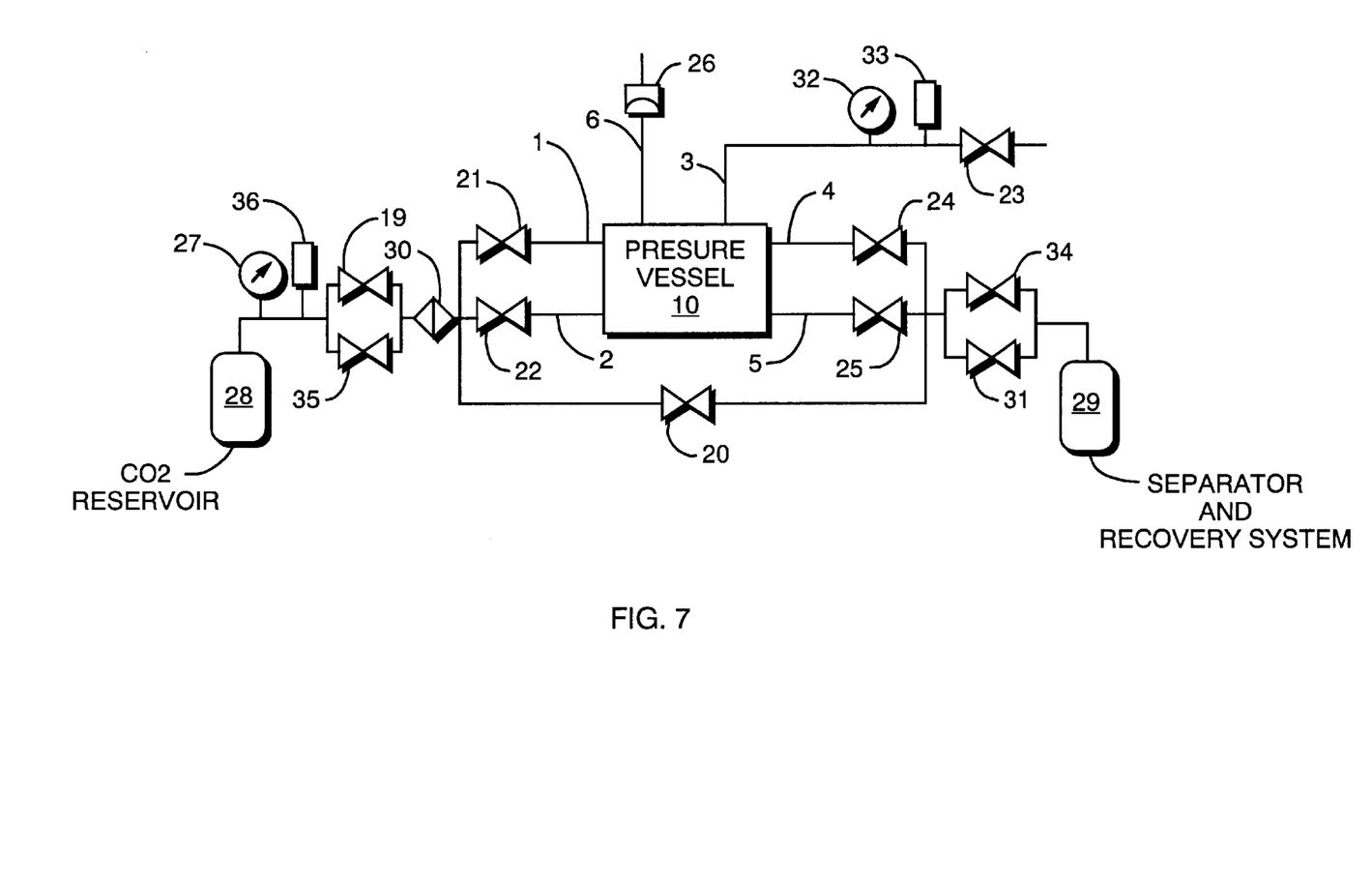
FIG. 7 is a schematic representation of the fluid valve and piping assembly of the embodiment of FIGS. 4, 5 and 6.

Referring to FIG. 7, the layout of different system valves and plumbing is shown. Reservoir (28) contains $CO_2$, which can be provided to process chamber of pressure vessel (10) at constant pressures higher than the critical point of $CO_2$. The reservoir pressure is read at pressure gauge (27). The different components shown on the supply side are the main reservoir valve low flow (19), main reservoir valve high flow (35), and inline filter (30). The different valves connected to the chamber are the container inlet valve (21), vessel inlet valve (22), purge line valve (23), container outlet valve (24), vessel outlet valve (25), dual inlet valve (20), recovery inlet line valve low flow (31), and recovery inlet line valve high flow (34). Other components include rupture disk for safety (26), chamber pressure gauge (32), chamber pressure transducer (33) and separator and recovery system (29).

Describing now the methodology for using the apparatus, wafer cassette (14), containing wafers (13) immersed in methanol, is placed into a container (12) so that the liquid level is about 10 mm below the top of container (12), and about 10 mm above the top of wafers (13). The alignment of the wafer cassette to the container is done via cassette alignment fixture (18), and alignment of the container to the base plate is done via container alignment fixture (17), assuring that the container and the wafers are repeatably indexed to a precise location on base plate (10).

The drying process is then started by pressing the start button on an associated control panel, not shown here but fully appreciated by those skilled in the art. The control panel display will prompt for any operator intervention and provides readout on process status during the drying cycle. Pressing the start button raises base plate (10). The base plate and pressure chamber (11) meet and are sealed via o-ring (16), and a locking mechanism (not shown) is actuated to provide suitable resistance to opening of the pressure vessel under all process operating pressures.

As noted, pressure vessel (11) has multiple process material supply and removal lines that penetrate the vessel wall. Comparing FIGS. 4, 5, and 6; notice that when base plate (10) is raised, vertically extending container inlet tube (1) and container outlet tube (4) which protrude downwardly from the roof of the chamber of pressure vessel (11), enter container (12) and extend to nearly the bottom of the container as base plate (10) is raised into place. At the same time, vertically extending vessel inlet tube (2) and vessel outlet tube (5) also protrude from the roof of the chamber of pressure vessel (11), not entering container (12) when the base plate (10) is raised, but extending outside the container nearly to the base plate, outside container (12).

Once the chamber of pressure vessel (11) is completely sealed, the main reservoir valve low flow (19), the dual inlet valve (20), the vessel inlet valve (22), the purge line valve (23), and the vessel outlet valve (25) are opened. The container inlet valve (21) and the container outlet valve (24) are closed. The recovery inlet valve low flow (31) and recovery inlet valve high flow (34) are both closed. It is important to pressurize the vessel slowly to avoid turbulence that might damage the microstructures on wafers (13). Carbon dioxide is introduced into the pressure chamber at a very slow rate, and the chamber pressure is monitored via readout from the pressure gauges (27), (32) and pressure transducers (33), (36). Since $CO_2$ is heavier than air, it slowly pushes air out of the chamber through purge line (3). This ensures the removal of air from the chamber. Purging is done until the chamber is completely filled with $CO_2$ and all air has been exhausted.

Next, the purge line valve (23) is closed, and the chamber is pressurized to about 700 psi. When 700 psi pressure is achieved, main reservoir valve high flow (35) is opened, and the chamber is pressurized faster to go to 1100 psi. Once the desired pressure is achieved, which is monitored via chamber pressure transducer (33) as well as chamber pressure gauge (32), the dual inlet valve (20), and vessel outlet valve (25), are closed. The system at this point contains methanol contained in the container and liquid $CO_2$, surrounding the container in the chamber.

The next step is removal of methanol from the system and its replacement with liquid $CO_2$. To do this, the container outlet valve (24), and the recovery inlet valve low flow (31), are opened, whereas vessel outlet valve (25) remains closed. The siphon action of the container outlet tube (4) ensures the flow of methanol from the vessel to the separator and recovery system. During this process step the methanol is continuously replaced by liquid $CO_2$. The constant flow of $CO_2$ via the vessel inlet tube (2) into the chamber finally results in removal of methanol from container (12).

The line coming from the recovery inlet line valve low flow (31) is monitored for end point detection to determine when the methanol has been replaced completely. Once no methanol is present, all system valves are closed. At this time the chamber is filled with liquid carbon dioxide at 1100 psi.

Next, using heat exchanger (9), the $CO_2$ in the pressure vessel is heated to about 35–40 degree centigrade to transform the liquid $CO_2$ into it's supercritical state. A thermocouple (not shown) is mounted within pressure vessel (11), which provides temperature information back to a system control computer. As heat is applied and the temperature of the $CO_2$ is raised, there is a corresponding increase in pressure. If the pressure reaches a value above a set point pressure calculated to be the maximum safe operating pressure for pressure vessel (11), the recovery inlet high flow valve (34) is opened to relieve the pressure.

Once the supercritical state is achieved, the container outlet valve (24), vessel outlet valve (25), recovery inlet valve high flow (34), are opened to achieve atmospheric pressure. As soon as the atmospheric pressure is achieved, the heat exchanger switches to cooling mode to bring the vessel to less than 25 degree centigrade. This ensures that at the start of the next cycle, the vessel will be at lower than critical temperature condition. The pressure vessel can now be opened, and wafer carrier (14) can be removed manually or by automatic means, leaving the system ready for the next drying cycle.

As will be realized, the invention is capable of other and different embodiments, including configurations adapted to handling wafers horizontally, as in a vertically stacked wafer cassette. Its several details are capable of modifications in various obvious respects, all without departing from the essence of the invention.

For example, there may be an apparatus for drying wafers in a supercritical environment, consisting of an inverted pressure vessel, a horizontal base plate, a wafer cassette configured for supporting at least one wafer for drying, a container sufficiently large to submerge the wafer cassette and at least one wafer in a first process fluid such as methanol, and where the container is also sufficiently small enough to fit on the base plate and within the pressure vessel. The apparatus may include a way for aligning the wafer cassette within the container, such as a simple fixture on the bottom of the container, and a way for aligning the container on the base plate, again such as a simple fixture on the base plate. The apparatus may also have an elevator or screw assembly or other lift and lock mechanism for bringing the pressure vessel and base plate into a closed and sealed relationship.

The apparatus may further include a way for displacing the air in the pressure vessel with a second process fluid in a gaseous state, such as Carbon Dioxide, and a way to elevate the second process fluid to a liquid state, and then displace the first process fluid in the container with the second process fluid without any intervening contact of the wafer by air or other substances. The apparatus may further include a way for elevating the second process fluid to a supercritical state, and then reducing pressure in the pressure vessel to ambient pressure. There may also be a way for cooling the remaining second process fluid to below its supercritical temperature.

Another example of the apparatus within the scope of the invention includes vertically downwardly extending vessel inlet and outlet tubes, where the tubes terminate outside the container and near the base plate, and a purge line outlet and associated valve at the roof of the pressure vessel. There may also be vertically downwardly extending container inlet and outlet tubes, where these tubes terminate inside the container and near the bottom of the container.

In yet another example, the pressure vessel may include an internal capability for heating and cooling, such as a heat exchanger connected to external sources of heated and cooled fluids, so that it can be operated in a heating or cooling mode. There may also be a purge line at the top of the pressure vessel and an associated purge line valve for venting the pressure vessel. And the apparatus may be set up with associated equipment for automatic loading of the pressure vessel with wafers submerged in the first process fluid.

As yet a further example, there is within the scope of the invention a method for drying wafers in a supercritical environment, consisting of using an apparatus of the invention and aligning a wafer cassette within the container, submerged in a first process fluid, aligning the container on the base plate, bringing the pressure vessel and base plate into a closed and sealed relationship, and displacing the air in the pressure vessel with a second process fluid in a gaseous state. The method may include elevating the second process fluid to a liquid state, displacing the first process fluid in the container with the second process fluid in its liquid state. The method may then include the steps of elevating the second process fluid to a supercritical state so as to dry the wafers, then reducing the pressure in the pressure vessel to ambient pressure, and cooling the second process fluid to below supercritical temperature.

What is claimed is:

1. An apparatus for drying wafers in a supercritical environment, comprising:
    an inverted pressure vessel,
    a horizontal base plate,
    a wafer cassette configured for supporting at least one wafer for drying,
    a container sufficiently large to submerge said wafer cassette and said at least one wafer in a first process fluid, said container also being sufficiently small to fit on said base plate and within said pressure vessel,
    means for aligning said wafer cassette within said container,
    means for aligning said container on said base plate,
    means for bringing said pressure vessel and said base plate into a closed and sealed relationship,
    means for displacing the air in said pressure vessel with a second process fluid in a gaseous state,
    means for elevating said second process fluid to a liquid state,
    means for displacing said first process fluid in said container with said second process fluid in said liquid state,
    means for elevating said second process fluid to a supercritical state,
    means for reducing pressure in said pressure vessel to ambient pressure, and
    means for cooling said second process fluid to below supercritical temperature.

2. An apparatus for drying wafers according to claim 1, said means for displacing the air in said pressure vessel with a second process fluid in a gaseous state comprising vertically downwardly extending vessel inlet and outlet tubes, said tubes terminating outside said container and near said base plate, and a purge line outlet and associated valve at the roof of said pressure vessel.

3. An apparatus for drying wafers according to claim 1, said means for elevating said second process fluid to a liquid state comprising means for increasing pressure within said pressure vessel.

4. An apparatus for drying wafers according to claim 1, said means for displacing said first process fluid in said container with said second process fluid in said liquid state comprising vertically downwardly extending container inlet and outlet tubes, said tubes terminating in said container and near the bottom of said container.

5. An apparatus for drying wafers according to claim 1, said means for elevating said second process fluid to a supercritical state comprising a heat exchanger within said pressure vessel for increasing the temperature of said second process fluid.

6. An apparatus for drying wafers according to claim 1, said means for reducing pressure in said pressure vessel to ambient pressure comprising a purge line at the top of said pressure vessel and an associated purge line valve for venting said pressure vessel.

7. An apparatus for drying wafers according to claim 1, said means for cooling said second process fluid to below supercritical temperature comprising switching said heat exchanger to cooling mode.

8. An apparatus for drying wafers according to claim 1, further comprising means for automatic loading of said pressure vessel with said wafers submerged in said first process fluid.

9. An apparatus for drying wafers in a supercritical environment, comprising:
    a stationary inverted pressure vessel,
    a vertically movable horizontal base plate,
    a wafer cassette configured for supporting at least one wafer for drying,
    a container sufficiently large to submerge said wafer cassette and said at least one wafer in a first process fluid, said container also being sufficiently small to fit on said base plate and within said pressure vessel,
    means for aligning said wafer cassette within said container,
    means for aligning said container on said base plate,
    means for elevating said base plate into a closed and sealed relationship with said pressure vessel,
    vertically downwardly extending vessel inlet and outlet tubes within said pressure vessel, said tubes terminating outside said container near said base plate,
    means for increasing pressure within said pressure vessel,
    vertically downwardly extending container inlet and outlet tubes within said pressure vessel, said tubes terminating in said container and near the bottom of said container,
    a heat exchanger within said pressure vessel, and
    a purge line at the top of said pressure vessel and an associated purge line valve for venting said pressure vessel.

10. An apparatus for drying wafers according to claim 9, further comprising means for automatic loading of said pressure vessel with said wafers submerged in said first process fluid.

11. A method for drying wafers in a supercritical environment, comprising:

using an inverted pressure vessel with a horizontal base plate, using a wafer cassette configured for supporting at least one wafer for drying, using a container sufficiently large to submerge said wafer cassette and said at least one wafer in a first process fluid, said container also being sufficiently small to fit on said base plate and within said pressure vessel, aligning said wafer cassette within said container, aligning said container on said base plate, bringing said pressure vessel and said base plate into a closed and sealed relationship, displacing the air in said pressure vessel with a second process fluid in a gaseous state, elevating said second process fluid to a liquid state, displacing said first process fluid in said container with said second process fluid in said liquid state, elevating said second process fluid to a supercritical state, reducing pressure in said pressure vessel to ambient pressure, and cooling said second process fluid to below supercritical temperature.

12. A method for drying wafers according to claim 11, said displacing the air in said pressure vessel with a second process fluid in a gaseous state comprising admitting said second process fluid into said pressure vessel through a vertically downwardly extending vessel inlet tube terminating outside said container and near said base plate, and exhausting said air through a purge line outlet located on the top-most part of said pressure vessel.

13. A method for drying wafers according to claim 11, said elevating said second process fluid to a liquid state comprising admitting additional said second process fluid into said pressure vessel under a pressure at least equal to the liquid state pressure of said second process fluid.

14. A method for drying wafers according to claim 11, said displacing said first process fluid in said container with said second process fluid in said liquid state comprising admitting additional said second process fluid in said liquid state into said container through a vertically downwardly extending container inlet tube and exhausting said first said process fluid from said container through a said container outlet tube, said tubes terminating inside said container and near the bottom of said container.

15. A method for drying wafers according to claim 11, said elevating said second process fluid to a supercritical state comprising applying heat to said second process fluid through a heat exchanger within said pressure vessel.

16. A method for drying wafers according to claim 11, said reducing pressure in said pressure vessel to ambient pressure comprising exhausting said second process fluid out a purge line at the top of said pressure vessel by operation of an associated valve.

17. A method for drying wafers according to claim 16, said reducing pressure in said pressure vessel to ambient pressure further comprising keeping the temperature of said second process fluid above its critical temperature.

18. A method for drying wafers according to claim 11, said pressure vessel including an internal heat exchanger connected to external heating and cooling sources, said cooling said second process fluid to below supercritical temperature comprising operating said heat exchanger in a cooling mode.

* * * * *

UNITED STATES PATENT AND TRADEMARK OFFICE
CERTIFICATE OF CORRECTION

PATENT NO.     : 6,334,266 B1                                               Page 1 of 1
DATED          : January 1, 2002
INVENTOR(S)    : Moritz, Heiko D.

It is certified that error appears in the above-identified patent and that said Letters Patent is hereby corrected as shown below:

<u>Title page,</u>
Item [54], Title, delete "AND METHOD OF USE"

Signed and Sealed this

Twentieth Day of August, 2002

*Attest:*

JAMES E. ROGAN
*Attesting Officer*          *Director of the United States Patent and Trademark Office*